(12) United States Patent
Motwani

(10) Patent No.: US 9,294,224 B2
(45) Date of Patent: Mar. 22, 2016

(54) MAXIMUM-LIKELIHOOD DECODER IN A MEMORY CONTROLLER FOR SYNCHRONIZATION

(75) Inventor: Ravi Motwani, San Diego, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/991,880

(22) PCT Filed: Sep. 28, 2011

(86) PCT No.: PCT/US2011/053663
§ 371 (c)(1),
(2), (4) Date: Jun. 5, 2013

(87) PCT Pub. No.: WO2013/048385
PCT Pub. Date: Apr. 4, 2013

(65) Prior Publication Data
US 2013/0259170 A1    Oct. 3, 2013

(51) Int. Cl.
*H03D 1/00* (2006.01)
*H04L 27/06* (2006.01)
*H04L 1/00* (2006.01)
*G06F 11/10* (2006.01)
*H03M 13/33* (2006.01)

(52) U.S. Cl.
CPC .......... *H04L 1/0054* (2013.01); *G06F 11/1072* (2013.01); *H03M 13/33* (2013.01)

(58) Field of Classification Search
CPC ... H04L 1/0054; H03M 13/33; G06F 11/1072
USPC ........................................................ 375/341
See application file for complete search history.

(56) References Cited

U.S. PATENT DOCUMENTS

| | | |
|---|---|---|
| 5,432,803 A | 7/1995 | Liu et al. |
| 5,912,839 A | 6/1999 | Ovshinsky et al. |
| 6,950,976 B1 | 9/2005 | Garrabrant et al. |
| 7,457,155 B2 | 11/2008 | Nazarian |
| 7,590,918 B2 | 9/2009 | Parkinson |
| 7,600,078 B1 | 10/2009 | Cen et al. |
| 7,756,053 B2 | 7/2010 | Thomas et al. |
| 7,913,147 B2 | 3/2011 | Swaminathan et al. |
| 7,984,360 B2 | 7/2011 | Sharon et al. |
| 8,462,537 B2 | 6/2013 | Karpov et al. |
| 8,462,577 B2 | 6/2013 | Zeng et al. |
| 8,463,948 B1 | 6/2013 | Qawami et al. |

(Continued)

OTHER PUBLICATIONS

International Search Report & Written Opinion mailed Feb. 28, 2012 for Int'l Patent Application No. PCT/US2011/053663.

(Continued)

*Primary Examiner* — Erin File
(74) *Attorney, Agent, or Firm* — Blakely, Sokoloff, Taylor & Zafman LLP

(57) ABSTRACT

Described herein are apparatus, system, and method for data synchronization via a maximum-likelihood decoder in a memory controller. The method comprises receiving a constrained codeword from a non-volatile memory (NVM) via a channel, the constrained codeword including an appended bit-stream; and decoding the received constrained codeword by reconstructing the appended bit-stream and invoking a synchronization procedure that applies a maximum-likelihood (ML) estimator to estimate locations of any insertion, deletion, or error in the reconstructed appended bit-stream.

30 Claims, 8 Drawing Sheets

(56) References Cited

U.S. PATENT DOCUMENTS

| | | | |
|---|---|---|---|
| 8,539,323 B2* | 9/2013 | Hui et al. | 714/794 |
| 8,549,380 B2 | 10/2013 | Motwani | |
| 8,549,382 B2 | 10/2013 | Motwani | |
| 8,605,531 B2 | 12/2013 | Kau | |
| 8,607,089 B2 | 12/2013 | Qawami et al. | |
| 8,612,676 B2 | 12/2013 | Dahlen et al. | |
| 8,612,809 B2 | 12/2013 | Casper et al. | |
| 8,649,212 B2 | 2/2014 | Kau et al. | |
| 8,667,360 B2 | 3/2014 | Motwani | |
| 8,838,935 B2 | 9/2014 | Hinton et al. | |
| 2003/0167438 A1* | 9/2003 | Aziz | 714/767 |
| 2007/0005922 A1 | 1/2007 | Swaminathan et al. | |
| 2007/0223618 A1 | 9/2007 | Jeong et al. | |
| 2008/0034148 A1 | 2/2008 | Gower et al. | |
| 2008/0065812 A1* | 3/2008 | Li et al. | 711/103 |
| 2008/0270811 A1 | 10/2008 | Chow et al. | |
| 2010/0070692 A1 | 3/2010 | Litsyn et al. | |
| 2010/0131827 A1 | 5/2010 | Sokolov et al. | |
| 2010/0146372 A1* | 6/2010 | Tomlinson et al. | 714/780 |
| 2010/0291867 A1 | 11/2010 | Abdulla et al. | |
| 2010/0293317 A1 | 11/2010 | Confalonieri et al. | |
| 2010/0306446 A1 | 12/2010 | Villa et al. | |
| 2010/0306453 A1 | 12/2010 | Doller | |
| 2010/0318718 A1 | 12/2010 | Eilert et al. | |
| 2011/0153916 A1 | 6/2011 | Chinnaswamy et al. | |
| 2011/0249495 A1* | 10/2011 | Cho et al. | 365/185.03 |
| 2011/0291884 A1 | 12/2011 | Oh et al. | |
| 2012/0020155 A1* | 1/2012 | Kim | 365/185.03 |
| 2012/0166897 A1* | 6/2012 | Franca-Neto et al. | 714/721 |
| 2012/0269282 A1* | 10/2012 | Jin et al. | 375/267 |
| 2013/0282967 A1 | 10/2013 | Ramanujan | |
| 2014/0075107 A1 | 3/2014 | Qawami et al. | |

OTHER PUBLICATIONS

Lee et al., "Architecting Phase Change Memory as a Scalable DRAM Alternative", ISCA '09, Jun. 20, 2009, 12 pgs., Austin, Texas, USA.

Condit et al., "Better I/O Through Byte-Addressable, Persistent Memory", SOSP '09, Oct. 11, 2009, pp. 133-146. Big Sky, Montana, USA.

Freitas et al., "Storage-class memory: The next storage system technology", IBM J. Res. & Dev., Jul./Sep. 2008, pp. 439-447, vol. 52, No. 4/5.

Akel et al., "Onyx: A Prototype Phase Change Memory Storage Array", www.flashmemorysummit.com/.../Proceeding_2011/08/11_S301_Akel.pdf, 5 pgs.

Mearian, "IBM announces computer memory breakthrough Phase-change memory offers 100 times the write performance of NAND flash", Jun. 30, 2011, 3 pgs.

Caulfield et al., "Moneta: A High-performance Storage Array Architecture for Next-generation, Non-volatile Memories", Micro 43: Proceedings of the 43rd Annual IEEE/ACM International Symposium on Microarchitecture, Atlanta, GA Dec. 2010 pp. 385-395.

"The Non-Volatile Systems Laboratory Coding for non-volatile memories", http://nvsl.ucsd.edu/ecc, printed Sep. 1, 2011. 2 pgs.

"The Non-Volatile Systems Laboratory Moneta and Onyx: Very Fast SS", http://nvsl.ucsd.edu/moneta/, 3 pgs.

"The Non-Volatile Systems Laboratory NV-Heaps: Fast and Safe Persistent Objects", http://nvsl.ucsd.edu/nvuheaps/, 2 pgs.

"Phase change memory-based 'moneta' system points to the future of computer storage", ScienceBlog, Jun. 2, 2011, 7 pgs.

Quereshi et al., "Scalable High Performance Main Memory System Using Phase-Change Memory Technology", ISCA '09, Jun. 20, 2009, 10 pgs., Austin, Texas, USA.

"Compressed NVRAM based Memory Systems", 9 pgs.

Bailey et al., "Operating System Implications of Fast, Cheap, Non-Volatile Memory" 13th USENIX, HOTOS11 2011, May 9-11, 2011, 5 pgs.

Raoux et al., "Phase-change random access memory: A scalable technology", IBM J. Res. & Dev., Jul./Sep. 2008, pp. 465-479, vol. 52, No. 4/5.

Chen et al., "Rethinking Database Algorithms for Phase Change Memory", 5th Biennial Conference on Innovative Data Systems Research (CIDR '11), Jan. 9, 2011, 11 pgs., Asilomar, California, USA.

Jacob et al., "The Memory System You Can't Avoid It, You Can't Ignore It, You Can't Fake It", 2009, 77 pgs., Morgan & Claypool.

Mogul et al., "Operating System Support for NVM+DRAM Hybrid Main Memory", 12th Workshop on Hot Topics in Operating Systems (HatOS XII), May 18, 2009, 9 pgs.

PCT Notification concerning Transmittal of International Preliminary Report on Patentability (Chapter I of the Patent Cooperation Treaty) for PCT Counterpart Application No. PCT/US2011/053663, 7 pgs., (Apr. 10, 2014).

Notice of Allowance in counterpart Korean Application No. 10-2014-7008374, mailed Jan. 14, 2016, 2 pages, partial translation.

* cited by examiner

```
┌─────────────────────────────────────────────────────────────┐
│  Initialize the to be appended bit-stream to a NULL stream  │
│                            501                              │
└─────────────────────────────────────────────────────────────┘
                              │
                              ▼
┌─────────────────────────────────────────────────────────────┐
│  Appending a one-bit to the appended bit-stream when the    │
│    special pattern is mapped to another pattern             │
│                            502                              │
└─────────────────────────────────────────────────────────────┘
                              │
                              ▼
┌─────────────────────────────────────────────────────────────┐
│  Appending a zero-bit to the appended bit-stream when the   │
│         special pattern remains unchanged                   │
│                            503                              │
└─────────────────────────────────────────────────────────────┘
                              │
                              ▼
┌─────────────────────────────────────────────────────────────┐
│  Inserting bits that indicate which of a special pattern,   │
│  for among the special patterns, occurred in an input       │
│                            504                              │
└─────────────────────────────────────────────────────────────┘
                              │
                              ▼
┌─────────────────────────────────────────────────────────────┐
│ Appending a predetermined bit pattern, at the end of the    │
│   appended bit-stream, to terminate the Trellis             │
│                            505                              │
└─────────────────────────────────────────────────────────────┘
```

FIG. 5

MAXIMUM-LIKELIHOOD DECODER IN A MEMORY CONTROLLER FOR SYNCHRONIZATION

CLAIM OF PRIORITY

This application claims the benefit of priority of International Patent Application No. PCT/US2011/053663 filed Sep. 28, 2011, titled "MAXIMUM-LIKELIHOOD DECODER IN A MEMORY CONTROLLER FOR SYNCHRONIZATION," which is incorporated by reference in its entirety.

FIELD OF THE INVENTION

Embodiments of the invention relate generally to the field of non-volatile memories. More particularly, embodiments of the invention relate to an apparatus, system, and method for data synchronization via maximum-likelihood decoding in a memory controller.

BACKGROUND

Flash memory (e.g., NAND Flash memory) comprises of grid of cells arranged in a rectangular lattice. A cell is a floating gate and the information is stored as charge in these floating gates. A multi-level-cell (MLC) stores more than one bit per cell. Programming of a cell in NAND Flash is attained by Fowler-Nordhiem tunneling until the ideal programmed voltage is attained. However, due to programming time constraints, some tolerance is accepted and the actual programmed voltage is allowed to be within some range of the ideal value.

The read level is a random variable with some distribution around the mean programming level. Errors occur during reads because of overlaps of the level distributions. If the raw bit error rate (RBER) has to be kept low, the distributions must be narrow. One possible reason why the distributions are broadened is the capacitive coupling between neighboring cells. This phenomenon is called inter-cell-interference (ICI). ICI is caused due to floating-gate to floating-gate coupling, and can be from mild to extreme.

BRIEF DESCRIPTION OF THE DRAWINGS

Embodiments of the invention will be understood more fully from the detailed description given below and from the accompanying drawings of various embodiments of the invention, which, however, should not be taken to limit the invention to the specific embodiments, but are for explanation and understanding only.

FIG. 4 is an example of a reconstructed appended bit-stream that mismatches with a noiseless appended bit-stream to trigger data synchronization, according to one embodiment of the invention.

FIG. 5 is a flowchart of an encoding method for generating a modified constrained code which is used for data synchronization via maximum-likelihood decoding, according to one embodiment of the invention.

SUMMARY

Figure 1:
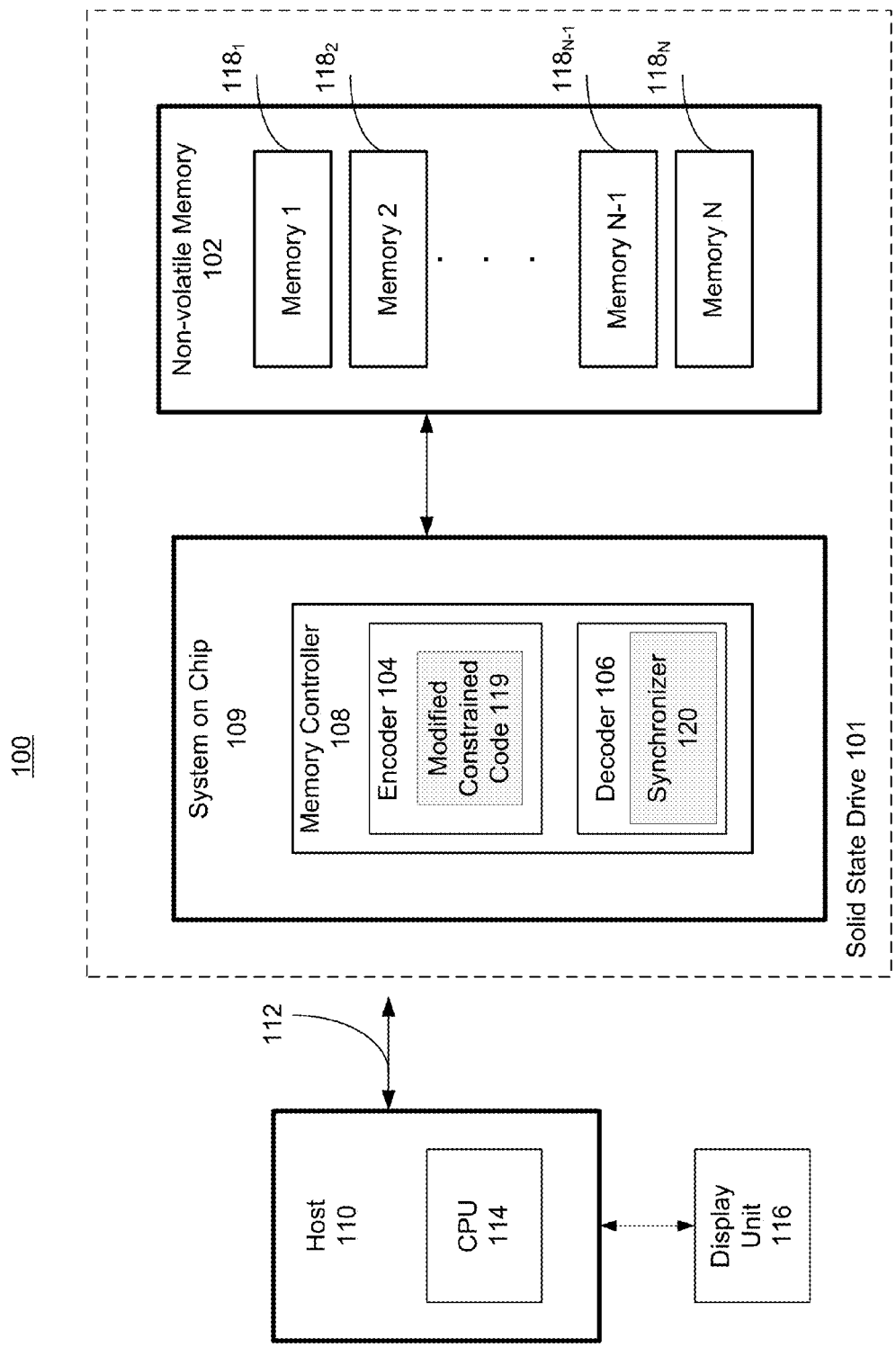
FIG. 1 is a high level system with non-volatile memory for data synchronization via maximum-likelihood decoding in a memory controller, according to one embodiment of the invention.

Embodiments of the invention relate to apparatus, system, and method for data synchronization via maximum-likelihood decoding in a memory controller coupled to a non-volatile memory (NVM).

In one embodiment, the method comprises: receiving a constrained codeword from a non-volatile memory (NVM) via a channel, the constrained codeword including an appended bit-stream; and decoding the received constrained codeword by reconstructing the appended bit-stream and invoking a synchronization procedure that applies a maximum-likelihood (ML) estimator to estimate locations of any insertion, deletion, or error in the reconstructed appended bit-stream.

In one embodiment, a memory controller (apparatus) comprises: a decoder to: receive a constrained codeword from a NVM via a channel, the constrained codeword including an appended bit-stream; and decode the received constrained codeword by reconstructing the appended bit-stream and invoking a synchronization procedure that applies a ML estimator to estimate locations of any insertion, deletion, or error in the reconstructed appended bit-stream.

In one embodiment, the system comprises: a solid state drive (SSD) comprising a memory controller coupled to a NVM via a channel, the memory controller comprises: a decoder to: receive a constrained codeword from the NVM via the channel, the constrained codeword including an appended bit-stream; and decode the received constrained codeword by reconstructing the appended bit-stream and invoking a synchronization procedure that applies a ML estimator to estimate locations of any insertion, deletion, or error in the reconstructed appended bit-stream; and a display unit to display contents stored in the SSD.

In one embodiment, an article of manufacture comprises a machine storage medium containing machine executable instructions that when executed cause a processor to perform a method, the method comprising: receiving a constrained codeword from a NVM via a channel, the constrained codeword including an appended bit-stream; and decoding the received constrained codeword by reconstructing the appended bit-stream and invoking a synchronization procedure that applies a ML estimator to estimate locations of any insertion, deletion, or error in the reconstructed appended bit-stream.

While the invention in this summary has been described in conjunction with specific embodiments thereof, many alternatives, modifications and variations of such embodiments will be apparent to those of ordinary skill in the art in light of the foregoing description. The embodiments of the invention are intended to embrace all such alternatives, modifications, and variations as to fall within the broad scope of the appended claims.

DETAILED DESCRIPTION

Embodiments of the invention relate to apparatus, system, and method for data synchronization via maximum-likelihood decoding in a memory controller coupled to a non-volatile memory (NVM). To combat ICI as discussed in the background section, constrained coding is a possible solution. Constrained coding entails forbidding certain adjacent-cell charge-level combinations. There can be various types of constrained codes, one type of constrained codes assumes that level information is available while decoding all pages. However, due to read latency requirements, level information may not be available while reading all pages. Furthermore, error propagation degrades the process of constrained decoding resulting in incorrect decoding of data.

The embodiments herein describe a modified constrained code which does not need level information while decoding all pages in the NVM. The technical effect of the modified constrained code is that the average read latency is reduced because level information is not required while decoding the lower and middle page. Furthermore, efficient synchronization is possible at the decoding end. Embodiments discussed herein reduce and/or eliminate error propagation, which is a crucial degrading factor for decoding variable length constrained codes, by using the modified constrained code which is robust to channel noise. The embodiments herein also describe a decoding algorithm for data synchronization that reduces (contains) error propagation.

In the following description, numerous details are discussed to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

In the following description and claims, the term "coupled" and its derivatives may be used. The term "coupled" herein refers to two or more elements which are in direct contact (physically, electrically, magnetically, optically, etc.). The term "coupled" herein may also refer to two or more elements that are not in direct contact with each other, but still cooperate or interact with each other.

As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

FIG. 1 is a high level memory system 100 for data synchronization via maximum-likelihood decoding in a memory controller, according to one embodiment of the invention. In one embodiment, the system 100 comprises a solid-state drive (SSD) 101. In one embodiment, the system 100 comprises a system on chip (SOC) 109 including a memory controller 108, and a processor 114 coupled to the memory controller 108. In one embodiment the memory controller 108 comprises an encoder 104 which is operable to generate a modified constrained code 119 that can be used for data synchronization. In one embodiment, the memory controller 108 comprises a decoder 106 with a synchronizer 120 to contain error propagation by synchronizing any mismatches in the data pattern (explained below with reference to FIGS. 2-7). In one embodiment, the SOC 109 includes other components, for example, a wireless antenna, memory, processor, etc.

In one embodiment, the SOC 109 communicates with the host 110 via a Serial Advance Technology Attachment (SATA) input-output (I/O) bus 112. In one embodiment, the SOC 109 communicates with the host 110 via a Serially Attached Small System Computer (SAS) input-output (I/O) bus 112. In other embodiments, other types of buses can be used for 112 without changing the essence of the embodiments, for example, any of a Small Computer Systems Interface (SCSI) input-output (I/O) bus, a Fiber Channel (FC) input-output (I/O) bus, a SCSI over Internet input-output (I/O) bus (iSCSI), or a Universal Serial Bus (USB) input-output (I/O) bus, Peripheral Component Interconnect Express (PCIe), etc.

In accordance with such embodiments, if the host 110 is to exchange data and/or commands with a memory device 101 in accordance with a SCSI protocol, the SCSI protocol may comply and/or be compatible with the protocol described in American National Standards Institute (ANSI) Small Computer Systems Interface-2 (SCSI-2) ANSI/International Committee for Information Technology Standards (INCITS) 131-1994 Specification.

In one embodiment, the SOC 109 and the NVM 102 is part of the SSD 101. In one such embodiment, the SOC 109 includes an NVM controller. In one embodiment, the SSD 101 is positioned inside a personal computer, a tablet, a smart phone (also referred to as a smart device), etc. In one embodiment, the memory controller 108 and/or the SOC 109 is a standalone integrated circuit coupled to the host 110 and the NVM 102. In another embodiment, the memory controller 108 and/or the SOC 109 is integrated in the host 110.

In one embodiment, the host 110 comprises a processor 114. In one embodiment, the processor 114 in the host 110 is a micro-processor designed and manufactured by INTEL CORP. of Santa Clara, Calif. In another embodiment, other processors made and designed by other vendors may be used for the host 110. In one embodiment, the host 110 is one of a personal computer, server, client, laptop, smart-phone, and/or tablet, etc. Embodiments may have one or multiple NVMs $118_{1-N}$ coupled to the memory controller 108. While some embodiments are described with respect to the memory controller 108 communicating with the host 110 and the NVM 102, it is understood that embodiments also operate with the SOC 109 communicating with the host 110 and the NVM 102.

In one embodiment, the non-volatile memory 102 is a random-access non-volatile memory (NVMRAM). In one embodiment, the NVM 102 is part of an SSD. In one embodiment the NVM 102 is a NAND flash memory having pages of data. In one embodiment the NVM 102 is a NOR flash memory. In one embodiment, the NVM 102 is one of a phase change memory (PCM), stacked PCM (PCMS, also referred to as PCM and switch), read-only memory (ROM), electrically erasable programmable read-only memory (EEPROM), or any other type of NVM device. In one embodiment, the NVM 102 is a removable drive, e.g., a Universal Serial Bus (USB) memory stick, flash card, etc.

In one embodiment, the host 110 is coupled to a display unit 116. In one embodiment, the display unit 116 is a touch pad which is operable to display the contents stored in the NVM 102.

Figure 2:
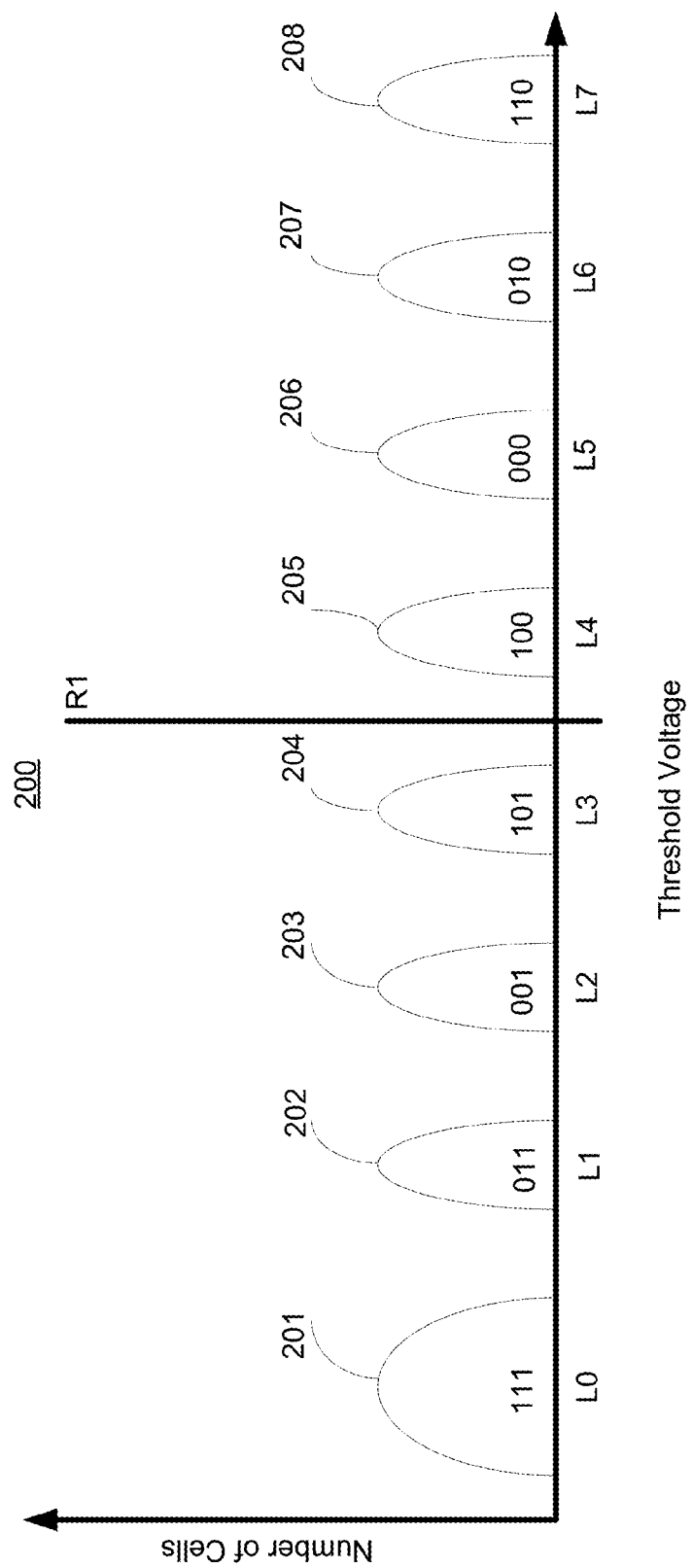
FIG. 2 is a voltage level distribution of 3 bits per cell for 8 levels.

FIG. 2 is a voltage level distribution 200 of 3 bits per cell for 8 levels. The x-axis represents threshold voltage levels of a cell, of a flash memory from among memories $118_{1-N}$, for a number of encoded levels. The y-axis represents normalized number of cells. As mentioned in the background section, Multi-level-cell (MLC) flash memory comprises cells which can be programmed to multiple voltage levels. MLC flash memory systems support a number of bits per cell, for example, 3 bits/cell, 4 bits/cell, etc. For 3 bits/cell to 4 bits/cell, individual cells are programmed to 8 or 16 distinct levels respectively. Due to capacitive coupling between neighboring cells, the threshold voltage of the cells depends on the coupling with the neighboring cells and their charge. This effect, known as inter-cell interference (ICI), causes the level distribution of the cells to broaden, effectively increasing the raw bit error rate (RBER).

One way to mitigate ICI is to use constrained codes. Each cell contains one bit for one page, i.e. each bit in a multi-bit cell is associated with a different page. For an embodiment with 3 bits/cell, a first bit corresponds to a lower page, a second bit corresponds to a middle page, and a third bit corresponds (is associated with) an upper page. As shown in FIG. 2, each cell can be programmed to 8 distinct levels 201-208 and each level corresponds to 3 bits of information. The bits corresponding to each voltage level distribution is mapped to a level. In this exemplary embodiment, bits 111 are mapped to level-0 (L0 201), bits 011 are mapped to level-1 (L1 202), bits 001 are mapped to level-2 (L2 203), bits 101 are mapped to level-3 (L3 204), bits 100 are mapped to level-4 (L4 205), bits 000 are mapped to level-5 (L5 206), bits 010 are mapped to level-6 (L6 207), and bits 110 are mapped to level-7 (L7 208). In other embodiments, other forms of mapping may be used.

During the read operation, the memory controller requests page information from the NVM, for example, the controller can request a lower page read from the NVN 102. For lower page read, threshold voltage level R1 is used and the bits are read out from the cell using R1. If traditional constrained coding is applied, then the bit information is not enough, level information is also needed for decoding the constrained code. Since the constrained code maps level information to bit information, to decode any page (whether upper, middle or lower), level information becomes mandatory. Such traditional constrained codes cause higher read latency which can become a performance bottleneck.

Embodiments discussed herein describe a modified constrained code 119 generated by the encoder 104. In one embodiment, the modified constrained code 119 does not need level information for encoding/decoding all pages as needed by the traditional constrained code. So as not to obscure the embodiments of the invention, the embodiments discussed herein use a 3 bit/cell example with seven levels. However, the embodiments can be used for any number of bits per cell.

In one embodiment, the modified constrained code eliminates or almost eliminates ICI for special patterns. One example of a special pattern is a level-7-level-0-level-7 pattern (L7-L0-L7). ICI is most severe for the special patterns since two high charge aggressors drift the threshold voltage for level-0 (L0). In the following embodiments, level-7-level-0-level-7 special patterns are abbreviated as 7-0-7.

Though only three special patterns (7-0-7, 7-0-6, and 6-0-7) are considered in the embodiments, the method can be generalized for any set of forbidden patterns (one or more patterns). The term "forbidden pattern" (also called special patterns) herein refers to level patterns that exhibit severe ICI because high charge aggressors (e.g., L7) drift the threshold voltage of a low charge victim (e.g., L0).

In one embodiment, the constrained decoder 106 needs level information for only decoding the upper page. In such an embodiment, the data of the lower and middle page is not impacted by the constrained encoding. The embodiments discussed herein can also be customized to design constrained codes which need level information for decoding the upper and middle pages but not the lower page. Hence, depending on the read latency requirements, the embodiments can be customized to requirements on level information availability.

Figure 3:
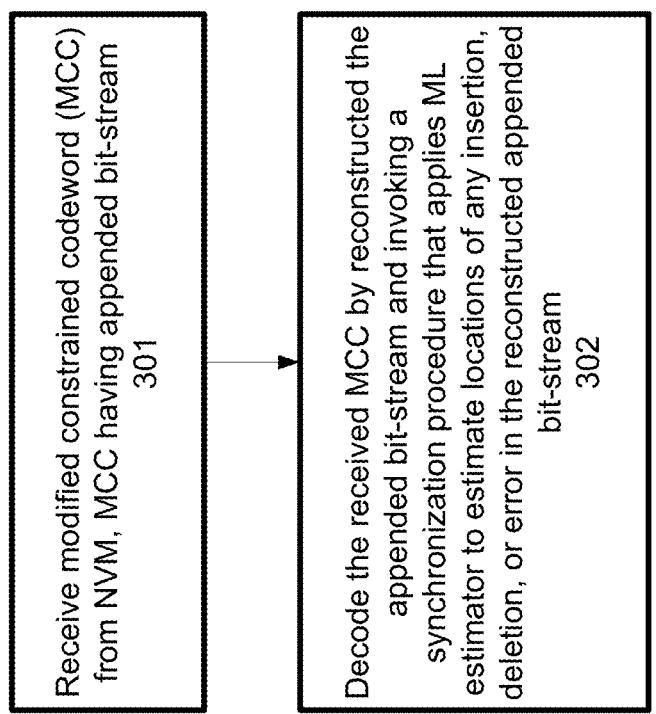
FIG. 3 is a high level flowchart of a method for data synchronization via a maximum-likelihood decoder, according to one embodiment of the invention.

FIG. 3 is a high level flowchart 300 of a method for data synchronization via the maximum-likelihood decoder 106 in the memory controller 108, according to one embodiment of the invention. FIG. 3 is discussed with reference to FIGS. 1-2. In one embodiment, the encoder 104 generates the modified constrained code 119. In one embodiment, the modified constrained code 119 is stored in the NVM 102 (e.g., in one of the memories $118_{1-N}$). In one embodiment, at block 301 the modified constrained code 119 stored in the NVM 102 is received by the decoder 106, where the modified constrained code 119 (discussed with reference to FIG. 4) includes an appended bit-stream corresponding to the three special patterns, bits indicating which of a special pattern occurred in the data pattern, and a termination pattern to terminate a Trellis (discussed with reference to FIG. 7).

At block 302, the decoder 106 invokes the synchronizer 120 that applies a maximum-likelihood estimator to estimate location of any insertion, deletion, or error in a reconstructed appended-bit stream. In the embodiments discussed herein the synchronizer 120 reduces/contains error propagation in the system 100.

FIG. 4 is an example 400 of the reconstructed appended bit-stream that mismatches with a noiseless appended bit-stream to trigger data synchronization by the synchronizer 120, according to one embodiment of the invention. The embodiment of FIG. 4 is an illustrating embodiment to illustrate by example when the data synchronizer 120 is invoked.

In one embodiment, the lower, upper and middle page bits are input to the constrained encoder 104 which maps these bits to levels. As mentioned above with reference to FIG. 2, the mapping from bits to levels consists of clubbing 3-bits at a time to generate one level. In one embodiment, the mapping of the bits is chosen to minimize the RBER. The extra bits generated by the constrained encoder are referred herein as appended bits. In one embodiment, the appended bit-stream is initialized to a null stream.

In one embodiment, the input which comprises of a sequence of levels is scanned from left to right by the encoder 104, where one level is incremented to the right every clock (and two levels if the last three levels are 7-0-7 or 6-1-6) and five consecutive levels are observed. In one embodiment, if a 7-0-7 pattern is seen as the last 3 levels in the five-tuple levels, it is replaced by a 6-1-6 pattern and the appended bit-stream is appended with a one-bit. In one embodiment, if a 6-1-6 pattern is seen in the last 3 levels in the 5-level pattern, the appended bit stream is appended with a zero-bit. In one embodiment, at the end of encoding the level information, the appended bit-stream is converted by the encoder 104 into levels and these levels are appended to the encoded level stream to create the modified constrained codeword 119.

In one embodiment, the encoder 104 only changes level-7 to level-6 and level-0 to level-1. In such an embodiment, the bits of the lower and middle page are left untouched by the encoding performed by the encoder 104. In one embodiment, the decoding, by the decoder 106, of the lower and middle page can be done without the knowledge of the level information. In one embodiment, the appended bit-stream is a variable length bit-stream. In one embodiment, the length of the appended bit-stream is a function of the input levels. In one embodiment, the length of the appended bit-stream is fixed to reduce the amount of overhead.

In one embodiment, the overhead size N is determined by a probability function N(p,m), where 'p' is the probability that the number of the special pattern 7-0-7 is smaller than a fixed number 'm.' In one embodiment, if the overhead size is fixed, the appended bit-stream length is fixed and it is initialized to all-zero bits.

In applications supporting variable length overheads, there can still be spurious 7-0-7 patterns in the overhead level information. For variable length overheads, the average rate of the code can be computed. Assuming perfect source coding, the input levels will have uniform distribution. Of all the three-tuple levels, one extra bit is required for two patterns only. Since overhead bits are mapped to levels, for every three-tuple levels, on an average $2/(8^3 3)$ levels are added. Hence, the average rate of this variable-rate constrained code is $8^3/(8^3+2/3)=0.9987$.

The following example illustrates the mapping for noiseless conditions. In one embodiment, the decoder 106 has a pointer to the appended bit-stream which is initialized to point to the first bit of the stream. In one embodiment, the encoded sequence of levels is scanned from left to right in increments of one level at each decode instant. In one embodiment, during each decode, 5 consecutive levels are observed and if a 6-1-6 pattern is seen as the last three levels in the 5-level read, one bit in the appended bit-stream pointed by the pointer is read. In one embodiment, if this bit is a 0, the level information is left unchanged. In one embodiment, if the bit is a 1, then the 6-1-6 pattern is changed to a 7-0-7 pattern. It is understood that the mapping can be reversed.

In one embodiment, the pointer is incremented to point to the next bit in the appended bit-stream. The invertibility of the mapping can be easily seen in the case of noiseless read. On the same construction principle, it is possible to construct constrained codes which eliminate (or almost eliminate) the 7-0-7, 7-0-6, and 6-0-7 patterns by mapping them to a 6-1-6, 7-1-6 and 6-1-7 patterns respectively (invertibility has to be ensured by proper encoder modification), according to one embodiment. The six patterns are referred herein as the special patterns.

In one embodiment, a one bit is appended to the appended bit-stream if the pattern is changed and a zero bit if the pattern is unchanged. Since there are six patterns which can add one bit (1/3 levels) to the appended bit-stream, the average rate of this constrained code is $8^3/(6/3+8^3)=0.9961$.

The data pattern 401 corresponds to a bit pattern in the form of levels. The bold and underlined level patterns correspond to the special patterns that cause the most ICI. The data pattern 401 is to be constrained encoded by the encoder 104. The data pattern 402 corresponds to constrained encoded code. The bold and underlined level patterns are the mapped patterns that map the bold and underlined special patterns of 401. As mentioned above, the sequences of special data patterns 7-0-7, 6-0-7, and 7-0-6 are mapped to sequences 6-1-6, 6-1-7, and 7-1-6 respectively. An appended bit stream 1110 is appended to the data pattern 402 which indicates that a special data pattern has been mapped to a new sequence. The appended bit-stream of 1110 in the above example is then mapped to the appended level-stream of level-0 (see 201 of FIG. 2) to form the modified constrained code 119.

Due to the broadened level distributions, a 6-1-6 pattern or 6-1-7 pattern or 7-1-6 pattern can read to a different (non-special) pattern. Alternately, a non-special pattern can be read out as a special pattern. This can cause error propagation since it off-tracks the appended bit-stream alignment with respect to the special pattern information. In one embodiment, an error in the appended bit-stream does not lead to error propagation since it is localized to its concerned pattern only. In order to keep the error propagation in check, the modified constrained code 119 is used, according to one embodiment.

In one embodiment, instead of appending one bit whenever one of the special pattern occurs (to indicate modification or no modification), three more bits are appended by the encoder 104 to indicate which of the six patterns occurred. In such an embodiment, a total of six special patterns have to be encoded, and three bits suffice. In one embodiment, four bits are appended for every special pattern. Hence for an average of $8^3$ patterns, 24 bits are appended, giving an average rate of $8^3/(24/3+8^3)=0.9865$ for the modified constrained code 119.

The embodiments herein are described with reference to a MLC which is 3 bit/cell NAND flash memory. The same concepts can be used for any number of bits per cell without changing the essence of the embodiments of the invention.

In one embodiment, during the read operation, the levels read are input to the decoder 106. In one embodiment, the special pattern information of the appended bit-stream is reconstructed from the read levels of the modified constrained code. This reconstructed stream is referred herein as the reproduced appended bit-stream.

In one embodiment, the special pattern information from the read appended bit-stream of the flash is then compared to the reproduced appended bit-stream. In the noiseless case, the reproduced appended bit-stream and the flash read appended bit-stream are the same. Assuming no errors in the appended bit-stream read, the noise in the level reads leads to an insertion/deletion channel.

The term "deletion" herein refers to a deletion in the modified constrained code read to the decoder 106. A deletion occurs if any of the special patterns is read as a non-special pattern. This causes loss of special pattern logging to occur in the reproduced appended bit-stream.

The term "insertion" herein refers to an insertion of data in the modified constrained code read to the decoder 106. An insertion occurs if a pattern which is not special is read out as a special pattern. This causes logging of non-special pattern as special pattern in the reproduced appended bit-stream.

In one embodiment, the reconstructed appended bit-stream is compared with the noisy appended bit-stream by the decoder 106. By comparing the reconstructed appended bit-stream and the noisy appended bit-stream synchronization can be attempted by the synchronizer 120, according to one embodiment. There can also be errors in the noisy appended bit-stream. In one embodiment, synchronization between the two sequences can be obtained by estimating positions of insertions, deletions, and errors. In one embodiment, the estimator in the synchronizer 120 which maximizes the probability of the reconstructed appended bit-stream conditioned on the read appended bit-stream is the maximum-likelihood (ML) estimator. In one embodiment, the ML estimator is the Viterbi detector is to recover from insertions, deletions and errors.

In one embodiment, the synchronizer 120 invokes the ML estimator when there is loss of synchronization between the two sequences—reconstructed appended bit-stream and the noisy appended bit-stream. In one embodiment, the estimator of the synchronizer 120 is operable to estimate if insertion, deletion, or error has occurred depending on which event has highest probability. Once synchronization is obtained, the catastrophic error propagation due to off-alignment of the special patterns and the appended bit-stream is avoided.

Continuing with the example of FIG. 4, the data pattern 403 represents the noisy levels readout by the decoder 106. The first 7-0-7 of 401, mapped to 6-1-6 in 402 by the encoder 104, is read-out as 6-1-5 in 403 by the decoder 106 as a deletion. The data pattern 5-1-7 of 402 is mapped to the 6-1-7 in 403 causing an insertion in the reconstructed appended bit-stream. In the appended bit-stream reconstructed from the noisy levels readout, the patterns reconstructed are (607) (706)(706)(616) . . . as shown by 404. The noiseless appended bit-stream readout would indicate levels (707)(706)(706)(616) . . . as shown by 405. In one embodiment, the synchronizer 120 invokes a synchronization algorithm to map the reconstructed appended bit-stream to the noisy appended bit-stream to find out the insertions/deletions and errors in the reconstructed appended bit-stream.

In one embodiment, if a successful synchronization occurs, it indicates that there is a deletion of the (707) and an insertion of the (607) pattern. In one embodiment, insertion is determined because the inserted special pattern location is known. In the example above, it is known that the insertion of the (607) pattern occurred in 404, so a mapping of this pattern to one of the most probable non-special patterns is to be done.

In one embodiment, deletion is identified by determining that a deletion occurred before the second (706) pattern in 404. In one embodiment, all 3 consecutive levels before the occurrence of the second pattern are compared to the 6-1-6 pattern and the most probable non-special pattern is mapped to the 6-1-6 pattern. In such an embodiment, synchronization also effectively reduces the error rate since correctly detected insertions and deletions help correct the level information and reduce the noise impact.

FIG. 5 is a flowchart 500 of an encoding method for generating the modified constrained code 119 which is used for data synchronization via the maximum-likelihood decoder 106, according to one embodiment of the invention.

Although the blocks in the flowchart 500 are shown in a particular order, the order of the actions can be modified. Thus, the illustrated embodiments can be performed in a different order, and some actions/blocks may be performed in parallel. Additionally, one or more actions/blocks can be omitted in various embodiments for generating the modified constrained code 119 which is used for data synchronization via the maximum-likelihood decoder 106. The blocks of the flowchart 500 are discussed with reference to FIGS. 1-4. To avoid repetitiveness, only the blocks are explained which summarize the description above with reference to FIGS. 1-4.

At block 501, the appended bit-stream is initialized by the encoder 104 to a NULL stream. The NULL stream ensures that the appended bit-stream has a known state, i.e. all bits are zeros, before it is modified with ones and zeros according to the presence of special patterns in the data stream. At block 502, the encoder 104 appends a one bit to the appended bit-stream (previously NULL) when a special pattern in the data stream is mapped to another pattern, for example, the bold and underlined pattern 707 at the left end of 401 is mapped to 616 at the left end of 402. At block 503, the encoder 104 appends a zero bit to the appended bit-stream when the special pattern in the data stream remains unchanged, for example, the bold and underlined pattern 616 at the right ends of 401 and 402. By appending one and zeros based on the special patterns, a constrained code is generated by the encoder 104.

At block 504, the constrained code is modified by the encoder 104 by inserting bits that indicate which of a special pattern, from among the special patterns, occurred in the data stream. For example, for representing the pattern 7-0-7, three bits may be used to indicate that a 7-0-7 pattern occurred in the data stream.

At block 505, a predetermined bit pattern is appended by the encoder 104 at the end of the appended bit-stream. In one embodiment, the predetermined bit pattern is used to terminate a Trellis which is generated by the synchronizer 120 during decoding and synchronization procedure.

Figure 6:
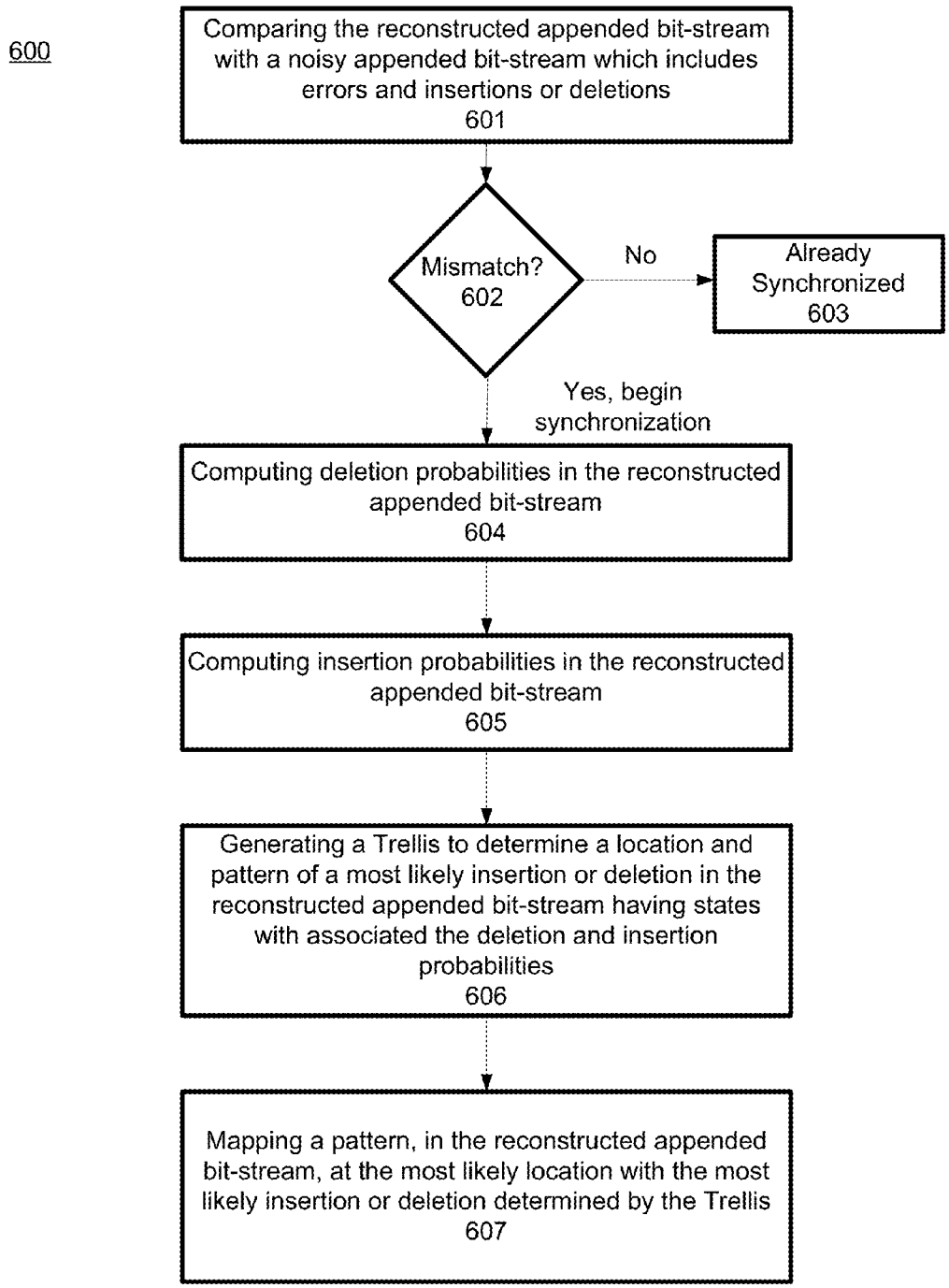
FIG. 6 is a flowchart of a decoding method for data synchronization via maximum-likelihood decoding, according to one embodiment of the invention.

FIG. 6 is a flowchart 600 of a decoding method for data synchronization via the maximum-likelihood decoder 106, according to one embodiment of the invention.

Although the blocks in the flowchart 600 are shown in a particular order, the order of the actions can be modified. Thus, the illustrated embodiments can be performed in a different order, and some actions/blocks may be performed in parallel. Additionally, one or more actions/blocks can be omitted in various embodiments for data synchronization via the maximum-likelihood decoder 106. The blocks of the flowchart 600 are discussed with reference to FIGS. 1-5. To avoid repetitiveness, only the blocks are explained which summarize the description above with reference to FIGS. 1-5.

In one embodiment, the decoder 106 reads the modified constrained code 119 from the NVM 102. In one embodiment, the decoder 106 generates the reconstructed bit-stream and at block 601 compares the reconstructed bit-stream with a noisy appended bit-stream which includes insertions, deletions, and errors. At block 602, the decoder 106 determines whether there is a mismatch in the reconstructed bit-stream and the noisy appended bit-stream in response to the comparing at block 601. If there is no mismatch, then at block 603 the two bit-streams are already synchronized and there is no need to trigger/invoke the synchronizer 120. If there is a mismatch, then the decoder 106 invokes the synchronizer 120 to execute blocks 604-607.

At block 604, the synchronizer 120 computes deletion probabilities in the reconstructed appended bit-stream. At block 605, the synchronizer 120 computes insertion probabilities in the reconstructed appended bit-stream. At block 606, the synchronizer 120 generates a Trellis to determine a location and patterns of a most likely insertion or deletion in the reconstructed appended bit-stream having states associated with the deletion and insertion probabilities computed in blocks 604 and 605. At block 607, a final pattern is mapped by mapping in the reconstructed appended bit-stream at the most likely location with the lost likely insertion or deletion determined by the Trellis. The synchronization procedures 604-607 are discussed in more detail with an example in FIG. 7.

Figure 7:
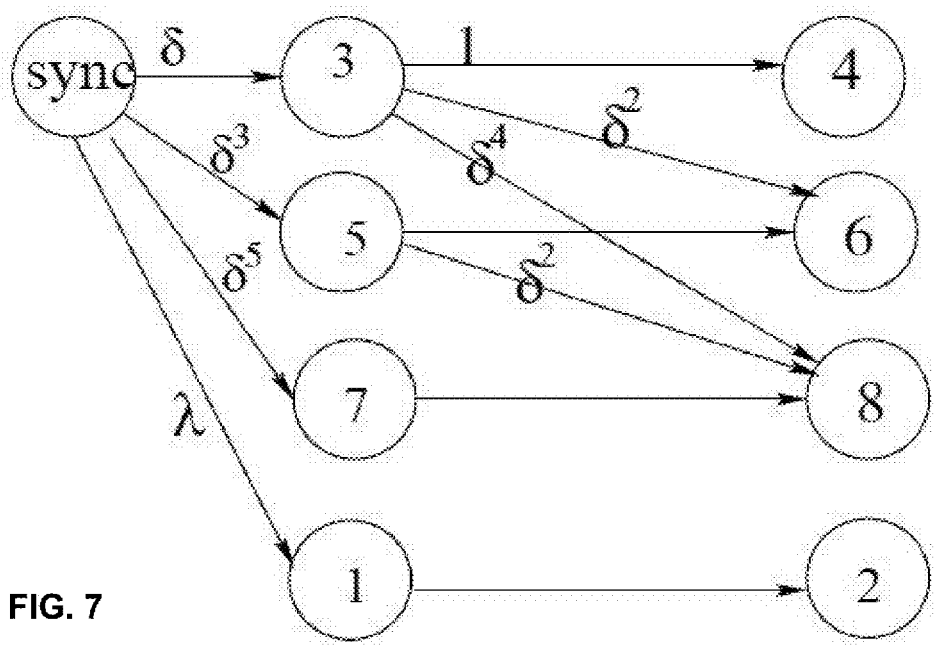
FIG. 7 is an exemplary Trellis for data synchronization for recovery from insertion and deletion errors, according to one embodiment of the invention.

FIG. 7 is an exemplary Trellis 700 for data synchronization for recovery from insertion and deletion errors, according to one embodiment of the invention.

As mentioned in blocks 604 and 605, the synchronizer 120 generates insertion and deletion probabilities. Let 'δ' be the probability of a deletion, and 'λ' be the probability of an insertion. Let the RBER be r. As mention above, a special pattern mapping to a non-special pattern creates a deletion. In the example discussed with reference to FIG. 4, considering the first left most bold and underlined pattern of 401, the 7-0-7 pattern is mapped to the 6-1-6 pattern in 402, a deletion occurs if any level in the 6-1-6 pattern is mapped to another level. In such an embodiment, a 6-1-6 pattern can transit to a non-special pattern with probability 6r. Hence the probability of deletion, δ is 6r. As mentioned above, an insertion occurs if any non-special pattern maps to the 6-1-6 pattern. The most probable patterns which can cause this are the 6-2-6, 5-1-6, 6-0-6, 6-1-5, 7-1-6, and 6-1-7. Hence, the probability of insertion, $12r/8^3$.

Let the read level information be r=$r_1 r_2 r_3$ ... and the noisy level information from the appended bit stream be y=$y_1 y_2 y_3$ .... Insertions/deletions occur in the r-sequence and errors occur in the y-sequence. The aim of synchronization by the synchronizer 120 is to align the 'r' sequence with the 'y' using the ML estimate for insertion/deletion and errors. The synchronizer 120 uses the fact that 'r' has insertions/deletions and 'y' has errors to proceed with the synchronization process.

So as not to obscure the embodiments of the invention, a synchronization analysis for insertions/deletions and errors in binary sequences is illustrated with the assumption of an error-free 'y.' The embodiment discussed herein, with reference to the above illustration, can be extended to error prone 'y' without changing the essence of the embodiments of the invention.

Consider three sequences 'A', 'B,' and 't' (time index) in FIG. 7. 'A' is the ideal bit-stream (which corresponds to the noiseless appended bit-stream) and 'B' is the bit-stream corrupted by insertions/deletions (which corresponds to the reconstructed appended bit-stream) and 't' is the time index sequence.

At time index 2, there is deletion. At time index 14, there is an insertion. In one embodiment, the decoder 106 compares sequences 'A' and 'B' starting from time index 1 and at the time index of mismatch, the synchronizer 120 is invoked to resynchronize sequence 'A' and 'B.' In one embodiment, the synchronizer 120 tries to estimate if insertions, deletions, errors or a combination of these occurred, whichever is most-probable. In one embodiment, a Trellis is constructed by the synchronizer 120 to determine the estimate if insertions, deletions, errors or a combination of these occurred, whichever is most-probable.

In one embodiment, the synchronizer 120 invokes an ML estimator to perform the above purpose. In one embodiment, the ML estimator is a modified Viterbi detector (truncated detector with a finite number of trellis sections) because a complete/traditional Viterbi detector would be computationally expensive.

As shown in FIG. 7, in one embodiment, the Trellis construction is started by the synchronizer 120 when there is loss of synchronization and then the most likely insertion/deletion pattern is traced to resynchronize the two sequences. As mentioned above, in the current analysis we assume that errors in the appended bit-stream do not occur, i.e. an error-free 'y.' In one embodiment, the probability of different states in the Trellis can be computed as a function of the probability of deletion and insertion.

In one embodiment, the Trellis starts from a sync state. In the example described above, since loss of sync occurs during time index 2 of sequence 'B,' the bit under consideration is bit 2 of sequence 'B.' For the first set of states emanating from the sync state, the numbers for the states indicate the time indices for the bit in sequence 'A' which syncs with bit 2 of sequence 'B.' There is an edge from the sync state to state 3 to indicate bit 2 of sequence 'B' and bit 3 of sequence 'A' are the same if one deletion occurs followed by no insertion/deletion.

The time index 2 for sequence 'B' syncs with time index 3 of sequence 'A' considering one deletion, so the probability of the edge connecting sync state to state 3 is given by $\delta(1-\delta)(1-\lambda)$. Similarly, the state with number 5 indicates three deletions followed by no insertion/deletions, hence its probability is $\delta^3(1-\delta)(1-\lambda)$. In one embodiment, since the $(1-\delta)(1-\lambda)$ term is common to all the edges, it is not considered in the calculations, as it does not change the estimate.

In one embodiment, the state with number 1 corresponds to an insertion, i.e. highest probability of insertion. Since there can be infinitely many states emanating from the sync state, the Trellis is pruned. In one embodiment, depending on the acceptable complexity, and the values of $\delta$ and $\lambda$, only those branches which have significant probabilities are retained. In one embodiment, if $\delta \gg \lambda$, more deletions are considered than insertion states.

The second section of the Trellis corresponds to bit in sequence 'B' at time index 3. The Trellis can technically grow indefinitely. There are various ways to make a decision. In one embodiment, after a fixed number of Trellis sections, say 'n', the state with the highest probability is selected and the synchronization is obtained considering the insertion/deletion combination given by that state. In one embodiment, the number 'n' depends on the number of states per Trellis section. In one embodiment, a decision is made by choosing the survivor state as the state with the highest probability. In one embodiment, once the survivor state is chosen, synchronization is asserted.

In one embodiment, the Trellis constructed above can be extended very easily to consider the case when the appended bit-stream has errors, i.e. an error-prone y. In one embodiment, a proper Trellis termination is required since truncation of the Trellis can deteriorate performance. As discussed in block 505, a fixed predetermined pattern is inserted at the end of the appended bit-stream for Trellis termination. In one embodiment, the terminating pattern is a non-zero string of required length.

In one embodiment, synchronization completes when a pattern (special or any forbidden pattern) is read to the decoder 106 and is mapped to the closest allowable pattern (in probabilistic sense) based on the Trellis. For example, if a 7-0-7 pattern is seen (or any forbidden pattern), it is mapped to the closest allowable pattern (in probabilistic sense).

In one embodiment, for applications where level information is available for decoding middle page also, there is more flexibility in the design of the codes. In such an embodiment, levels 0, 1, 2, and 3 can be grouped together and levels 4, 5, 6, and 7 can be grouped together and the code design permits level mapping within the groups but not between groups. Such an embodiment ensures that the lower page bits are untouched by the constrained encoding.

Figure 8:
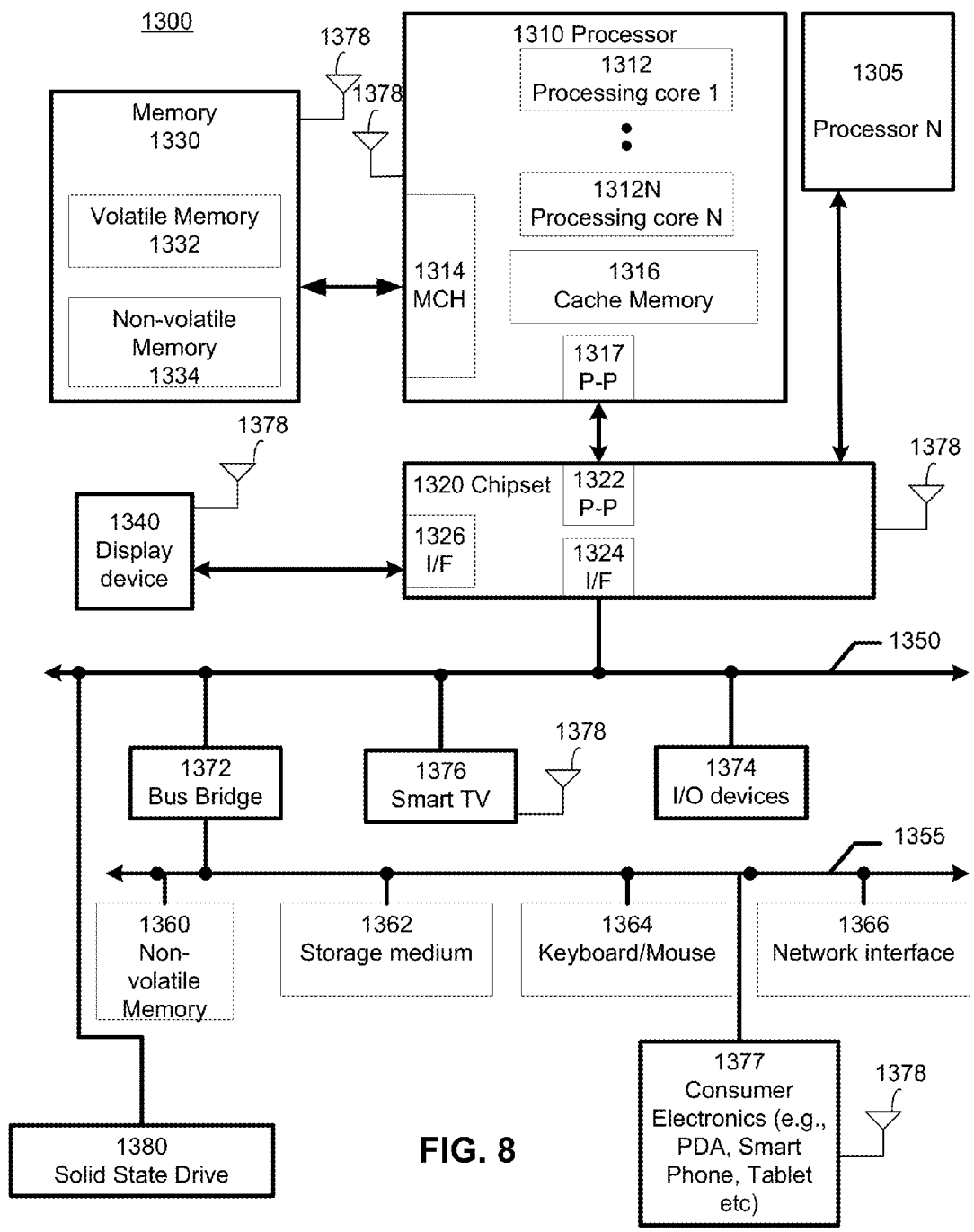
FIG. 8 is a system level diagram comprising a processor and/or memory controller for data synchronization via maximum-likelihood decoding, according to one embodiment of the invention.

FIG. 8 is a system level diagram 1300 comprising a processor and/or memory controller for generating a modified constrained code by the encoder 104, the modified constrained code used for data synchronization via the maximum-likelihood decoder 106 in the memory controller, according to one embodiment of the invention.

FIG. 8 also includes a machine-readable storage medium to execute computer readable instructions to perform the methods of various embodiments. Elements of embodiments are also provided as a machine-readable medium for storing the computer-executable instructions (e.g., instructions to implement the flowchart and processes of FIG. 4-6). The machine-readable medium may include, but is not limited to, flash memory, optical disks, CD-ROMs, DVD ROMs, RAMs, EPROMs, EEPROMs, magnetic or optical cards, or other type of machine-readable media suitable for storing electronic or computer-executable instructions. For example, embodiments of the invention may be downloaded as a computer program (e.g., BIOS) which may be transferred from a remote computer (e.g., a server) to a requesting computer (e.g., a client) by way of data signals via a communication link (e.g., a modem or network connection). In one embodiment, the machine-readable media may be located in the SSD 101 (part of SOC 109).

In one embodiment, the system 1300 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In another embodiment, the system 1300 implements the methods disclosed herein and may be a system on a chip (SOC) system.

In one embodiment, the processor 1310 has one or more processing cores 1312 and 1312N, where 1312N represents the Nth processor core inside the processor 1310 where N is a positive integer. In one embodiment, the system 1300 includes multiple processors including processors 1310 and 1305, where processor 1305 has logic similar or identical to logic of processor 1310. In one embodiment, the system 1300 includes multiple processors including processors 1310 and 1305 such that processor 1305 has logic that is completely independent from the logic of processor 1310. In such an embodiment, a multi-package system 1300 is a heterogeneous multi-package system because the processors 1305 and 1310 have different logic units. In one embodiment, the processing core 1312 includes, but is not limited to, pre-fetch logic to fetch instructions, decode logic to decode the instructions, execution logic to execute instructions and the like. In one embodiment, the processor 1310 has a cache memory 1316 to cache instructions and/or data of the system 1300. In another embodiment of the invention, the cache memory 1316 includes level one, level two and level three, cache memory, or any other configuration of the cache memory within the processor 1310.

In one embodiment, processor 1310 includes a memory control hub (MCH) 1314, which is operable to perform functions that enable the processor 1310 to access and communicate with a memory 1330 that includes a volatile memory 1332 and/or a non-volatile memory 1334. In one embodiment, the memory control hub (MCH) 1314 is positioned outside of the processor 1310 as an independent integrated circuit.

In one embodiment, the processor 1310 is operable to communicate with the memory 1330 and a chipset 1320. In one embodiment, the processor 1310 (same as 114 of FIG. 1) and the chipset 1320 are part of the host 110 of FIG. 1. In one embodiment, the chipset 1320 is coupled to a SSD 1380 (same as 101 of FIG. 1) via a SATA bus 1350 (same as bus 112 of FIG. 1). In one embodiment, the SSD 1380 includes machine-readable medium for storing the computer-executable instructions to implement the flowchart and processes of FIGS. 4-6. In such an embodiment, the SSD 1380 executes the computer-executable instructions when the SSD 1380 is powered up.

In one embodiment, the processor 1310 is also coupled to a wireless antenna 1378 to communicate with any device configured to transmit and/or receive wireless signals. In one embodiment, the wireless antenna interface 1378 operates in accordance with, but is not limited to, the IEEE 802.11 standard and its related family, HomePlug AV (HPAV), Ultra Wide Band (UWB), Bluetooth, WiMAX, or any form of wireless communication protocol.

In one embodiment, the volatile memory 1332 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 1334 includes, but is not limited to, flash memory (e.g., NAND, NOR), phase change memory (PCM), read-only memory (ROM), electrically erasable programmable read-only memory (EEPROM), or any other type of non-volatile memory device.

The memory 1330 stores information and instructions to be executed by the processor 1310. In one embodiment, memory 1330 may also store temporary variables or other intermediate information while the processor 1310 is executing instructions. In one embodiment, chipset 1320 connects with processor 1310 via Point-to-Point (PtP or P-P) interfaces 1317 and 1322. In one embodiment, chipset 1320 enables processor 1310 to connect to other modules in the system 1300. In one embodiment of the invention, interfaces 1317 and 1322 operate in accordance with a PtP communication protocol such as the INTEL® QuickPath Interconnect (QPI) or the like.

In one embodiment, the chipset 1320 is operable to communicate with the processor 1310, 1305, display device 1340, and other devices 1372, 1376, 1374, 1360, 1362, 1364, 1366, 1377, etc. In one embodiment, the chipset 1320 is also coupled to a wireless antenna 1378 to communicate with any device configured to transmit and/or receive wireless signals.

In one embodiment, chipset 1320 connects to a display device 1340 via an interface 1326. In one embodiment, the display 1340 includes, but is not limited to, liquid crystal display (LCD), plasma, cathode ray tube (CRT) display, or any other form of visual display device. In one embodiment of the invention, processor 1310 and chipset 1320 are merged into a single SOC. In addition, the chipset 1320 connects to one or more buses 1350 and 1355 that interconnect various modules 1374, 1360, 1362, 1364, and 1366. In one embodiment, buses 1350 and 1355 may be interconnected together via a bus bridge 1372 if there is a mismatch in bus speed or communication protocol. In one embodiment, chipset 1320 couples with, but is not limited to, a non-volatile memory 1360, a mass storage device(s) 1362, a keyboard/mouse 1364, and a network interface 1366 via interface 1324, smart TV 1376, consumer electronics 1377, etc.

In one embodiment, the mass storage device 1362 includes, but is not limited to, a solid state drive, a hard disk drive, a universal serial bus flash memory drive, or any other form of computer data storage medium. In one embodiment, network interface 1366 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, HomePlug AV (HPAV), Ultra Wide Band (UWB), Bluetooth, WiMAX, or any form of wireless communication protocol.

While the modules shown in FIG. 5 are depicted as separate blocks within the system 1300, the functions performed by some of these blocks may be integrated within a single semiconductor circuit or may be implemented using two or more separate integrated circuits. For example, although the cache memory 1316 is depicted as a separate block within the processor 1310, the cache memory 1316 can be incorporated into the processor core 1312 respectively. In one embodiment, the system 1300 may include more than one processor/processing core in another embodiment of the invention.

Reference in the specification to an "embodiment," "one embodiment," "some embodiments," or "other embodiments" means that a particular feature, structure, or characteristic described in connection with the embodiments is included in at least some embodiments, but not necessarily all embodiments. The various appearances of an "embodiment," "one embodiment," or some "embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

While the invention has been described in conjunction with specific embodiments thereof, many alternatives, modifications and variations of such embodiments will be apparent to those of ordinary skill in the art in light of the foregoing description. The embodiments of the invention are intended to embrace all such alternatives, modifications, and variations as to fall within the broad scope of the appended claims.

I claim:

1. A method comprising:
   receiving a constrained codeword from a non-volatile memory (NVM) via a channel, wherein the NVM is a multi-level cell memory in which cells that store different bit combinations are accessible with different voltage levels and wherein data content of the NVM is organized into pages of information where bits of a same bit combination map to a different page, the constrained codeword including an appended bit-stream; and
   decoding the received constrained codeword with the use of voltage level information for some but not all of the pages by reconstructing the appended bit-stream and invoking a synchronization procedure that applies a maximum-likelihood (ML) estimator to estimate locations of any insertion, deletion, or error in the reconstructed appended bit-stream.

2. The method of claim 1, wherein the appended bit stream is generated by inserting bits that indicate which of a special pattern, from among special patterns, occurred in an input.

3. The method of claim 2, wherein the appended bit-stream is further generated by:
   appending a one-bit to the appended bit-stream when the special pattern is mapped to another pattern; and
   appending a zero-bit to the appended bit-stream when the special pattern remains unchanged.

4. The method of claim 2, wherein decoding comprises:
   comparing the reconstructed appended bit-stream with a noisy appended bit-stream which includes errors and insertions or deletions, the comparing to determine any mismatch between the reconstructed appended bit-stream and the noisy appended bit-stream,
   wherein the synchronization procedure is invoked when a mismatch is determined.

5. The method of claim 2, wherein the special patterns for a 3-bit multi-level-cell (MLC) include:
   a 7-0-7 level pattern;
   a 6-0-7 level pattern;
   a 7-0-6 level pattern;
   a 6-1-6 level pattern;
   a 6-1-7 level pattern; and
   a 7-1-6 level pattern.

6. The method of claim 1, wherein the synchronization procedure comprises:
   generating a Trellis to determine a location and pattern of a most likely insertion or deletion in the reconstructed appended bit-stream, the Trellis having states with associated deletion and insertion probabilities; and
   mapping a pattern, in the reconstructed appended bit-stream, at the most likely location with the most likely insertion or deletion determined by the Trellis.

7. The method of claim 6, wherein the synchronization procedure comprises:
   computing the deletion probabilities in the reconstructed appended bit-stream; and
   computing the insertion probabilities in the reconstructed appended bit-stream.

8. The method of claim 6 further comprises:
   appending a predetermined bit pattern, at the end of the appended bit-stream, to terminate the Trellis.

9. The method of claim 8, wherein the predetermined bit pattern is a non-zero bit pattern.

10. The method of claim 1, wherein the ML estimator is a truncated Viterbi detector to estimate whether an insertion, deletion, or an error occurred in the reconstructed appended bit-stream.

11. The method of claim 1 further comprises:
    initializing the appended bit-stream to a null stream.

12. The method of claim 1, wherein the NVM is a NAND flash memory.

13. The method of claim 1, wherein the appended bit-stream is a variable length bit-stream.

14. A memory controller comprising:
    a decoder circuit to:
      receive a constrained codeword from a non-volatile memory (NVM) via a channel, wherein the NVM is a multi-level cell memory in which cells that store different bit combinations are accessible with different voltage levels and wherein data content of the NVM is organized into pages of information where bits of a same bit combination map to a different page, the constrained codeword including an appended bit-stream; and
      decode the received constrained codeword with the use of voltage level information for some but not all of the pages by reconstructing the appended bit-stream and invoking a synchronization procedure that applies a maximum-likelihood (ML) estimator to estimate locations of any insertion, deletion, or error in the reconstructed appended bit-stream.

15. The memory controller of claim 14 further comprising:
    an encoder circuit to:
      generate the appended bit stream by inserting bits that indicate which of a special pattern, from among special patterns, occurred in an input;
      append a one-bit to the appended bit-stream when the special pattern is mapped to another pattern; and
      append a zero-bit to the appended bit-stream when the special pattern remains is unchanged.

16. The memory controller of claim 15, wherein the encoder circuit is operable to:
    append a predetermined bit pattern, at the end of the appended bit-stream, to terminate the Trellis.

17. The memory controller of claim 16, wherein the predetermined bit pattern is a non-zero bit pattern.

18. The memory controller of claim 15, wherein the encoder is to:
    initialize the appended bit-stream to a null stream.

19. The memory controller of claim 14, wherein the decoder circuit is operable to:
    compare the reconstructed appended bit-stream with a noisy appended bit-stream which includes errors and insertions or deletions, the comparison to determine any mismatch between the reconstructed appended bit-stream and the noisy appended bit-stream,
    wherein the synchronization procedure is invoked when a mismatch is determined.

20. The memory controller of claim 14, wherein the decoder circuit is operable to perform the synchronization procedure by:

generating a Trellis to determine a location and pattern of a most likely insertion or deletion in the reconstructed appended bit-stream, the Trellis having states with associated deletion and insertion probabilities; and mapping a pattern, in the reconstructed appended bit-stream, at the most likely location with the most likely insertion or deletion determined by the Trellis.

21. The memory controller of claim 20, wherein the decoder circuit is further operable to:
compute the deletion probabilities in the reconstructed appended bit-stream; and
compute the insertion probabilities in the reconstructed appended bit-stream.

22. The memory controller of claim 14, wherein the ML estimator is a truncated Viterbi detector to estimate whether an insertion, deletion, or an error occurred in the reconstructed appended bit-stream.

23. The memory controller of claim 14, wherein the NVM is a NAND flash memory.

24. A system comprising:
one or more processors coupled to a memory controller, the memory controller coupled to a non-volatile memory (NVM) via a channel, wherein the NVM is a multi-level cell memory in which cells that store different bit combinations are accessible with different voltage levels and wherein data content of the NVM is organized into pages of information where bits of a same bit combination map to a different page, the memory controller comprises:
a decoder circuit to:
receive a constrained codeword from the NVM via the channel, the constrained codeword including an appended bit-stream; and
decode the received constrained codeword with the use of voltage level information for some but not all of the pages by reconstructing the appended bit-stream and invoking a synchronization procedure that applies a maximum-likelihood (ML) estimator to estimate locations of any insertion, deletion, or error in the reconstructed appended bit-stream; and
a display unit to display stored content.

25. The system of claim 24 further comprises:
an encoder circuit to:
generate the appended bit stream by inserting bits that indicate which of a special pattern, from among special patterns, occurred in an input;
append a one-bit to the appended bit-stream when the special pattern is mapped to another pattern; and
append a zero-bit to the appended bit-stream when the special pattern remains is unchanged.

26. The system of claim 25, wherein the encoder circuit is operable to:
append a predetermined bit pattern, at the end of the appended bit-stream, to terminate the Trellis.

27. The system of claim 24, wherein the decoder circuit is operable to:
compare the reconstructed appended bit-stream with a noisy appended bit-stream which includes errors and insertions or deletions, the comparing to determine any mismatch between the reconstructed appended bit-stream and the noisy appended bit-stream,
wherein the synchronization procedure is invoked when a mismatch is determined.

28. The system of claim 24, wherein the decoder circuit is operable to perform the synchronization procedure by:
generating a Trellis to determine a location and pattern of a most likely insertion or deletion in the reconstructed appended bit-stream, the Trellis having states with associated deletion and insertion probabilities; and
mapping a pattern, in the reconstructed appended bit-stream, at the most likely location with the most likely insertion or deletion determined by the Trellis.

29. The system of claim 24, wherein the NVM is a NAND flash memory.

30. An article of manufacture having a machine storage medium containing machine executable instructions that when executed cause a processor to perform a method, the method comprising:
receiving a constrained codeword from a non-volatile memory (NVM) via a channel, wherein the NVM is a multi-level cell memory in which cells that store different bit combinations are accessible with different voltage levels and wherein data content of the NVM is organized into pages of information where bits of a same bit combination map to a different page, the constrained codeword including an appended bit-stream; and
decoding the received constrained codeword with the use of voltage level information for some but not all of the pages by reconstructing the appended bit-stream and invoking a synchronization procedure that applies a maximum-likelihood (ML) estimator to estimate locations of any insertion, deletion, or error in the reconstructed appended bit-stream.

* * * * *